United States Patent
Sarkar et al.

(10) Patent No.: US 8,450,832 B2
(45) Date of Patent: May 28, 2013

(54) LARGE TUNING RANGE JUNCTION VARACTOR

(75) Inventors: Manju Sarkar, Singapore (SG); Purakh Raj Verma, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 473 days.

(21) Appl. No.: 11/696,732

(22) Filed: Apr. 5, 2007

(65) Prior Publication Data
US 2008/0246119 A1    Oct. 9, 2008

(51) Int. Cl.
*H01L 29/93*    (2006.01)

(52) U.S. Cl.
USPC ........... 257/595; 257/532; 257/598; 257/596; 257/601; 257/E21.364; 257/E27.049; 257/E29.344; 438/379; 438/393; 438/394; 438/395

(58) Field of Classification Search
USPC .............. 257/532, 595, 598, 601, E21.364, 257/E27.049, E29.344, 596; 438/393, 394, 438/395, 379
See application file for complete search history.

(56) References Cited

U.S. PATENT DOCUMENTS

| | | | |
|---|---|---|---|
| 5,500,387 A | 3/1996 | Tung et al. | |
| 5,525,533 A | 6/1996 | Woodruff et al. | |
| 5,608,258 A | 3/1997 | Rajkanan et al. | |
| 5,936,282 A * | 8/1999 | Baba et al. | 257/355 |
| 5,998,255 A | 12/1999 | Kung et al. | |
| 6,111,449 A * | 8/2000 | Tobita | 327/327 |
| 6,222,221 B1 | 4/2001 | Hou et al. | |
| 6,407,412 B1 | 6/2002 | Iniewski et al. | |
| 6,489,196 B1 | 12/2002 | Lin et al. | |
| 6,667,506 B1 | 12/2003 | Reedy et al. | |
| 6,667,539 B2 | 12/2003 | Adler | |
| 6,825,089 B1 | 11/2004 | Shapira et al. | |
| 6,847,095 B2 | 1/2005 | Benaissa et al. | |
| 6,864,528 B2 | 3/2005 | Maget | |
| 6,891,207 B2 * | 5/2005 | Pequignot et al. | 257/173 |
| 6,943,399 B1 | 9/2005 | Gau | |
| 7,019,384 B2 | 3/2006 | Maget et al. | |
| 7,023,676 B2 * | 4/2006 | Ker et al. | 361/56 |
| 7,067,384 B1 | 6/2006 | Vashchenko et al. | |
| 2004/0207003 A1 | 10/2004 | Kim | |
| 2005/0133869 A1 * | 6/2005 | Ker et al. | 257/355 |
| 2005/0179113 A1 | 8/2005 | Kim et al. | |
| 2006/0006431 A1 | 1/2006 | Jean et al. | |
| 2006/0030114 A1 * | 2/2006 | Yeh et al. | 438/379 |
| 2007/0013026 A1 * | 1/2007 | Kao | 257/532 |
| 2008/0149983 A1 | 6/2008 | Rassel et al. | |

OTHER PUBLICATIONS

Herbert S. Bennett et al., Device Technology Evolution for Si-Based RF Integrated Circuits, IEEE Transactions on Electron Devices, vol. 52, No. 7, Jul. 2005, pp. 1235-1258.

* cited by examiner

*Primary Examiner* — Robert Huber
(74) *Attorney, Agent, or Firm* — Horizon IP Pte. Ltd.

(57) ABSTRACT

Large tuning range junction varactor includes first and second junction capacitors coupled in parallel between first and second varactor terminals. First and second plates of the capacitors are formed by three alternating doped regions in a substrate. The first and third doped regions are of the same type sandwiching the second doped region of the second type. A first input terminal is coupled to the first and third doped regions and a second terminal is coupled to the second doped region. At the interfaces of the doped regions are first and second depletion regions whose width can be varied by varying the voltage across the terminals from zero to full reverse bias.

21 Claims, 11 Drawing Sheets

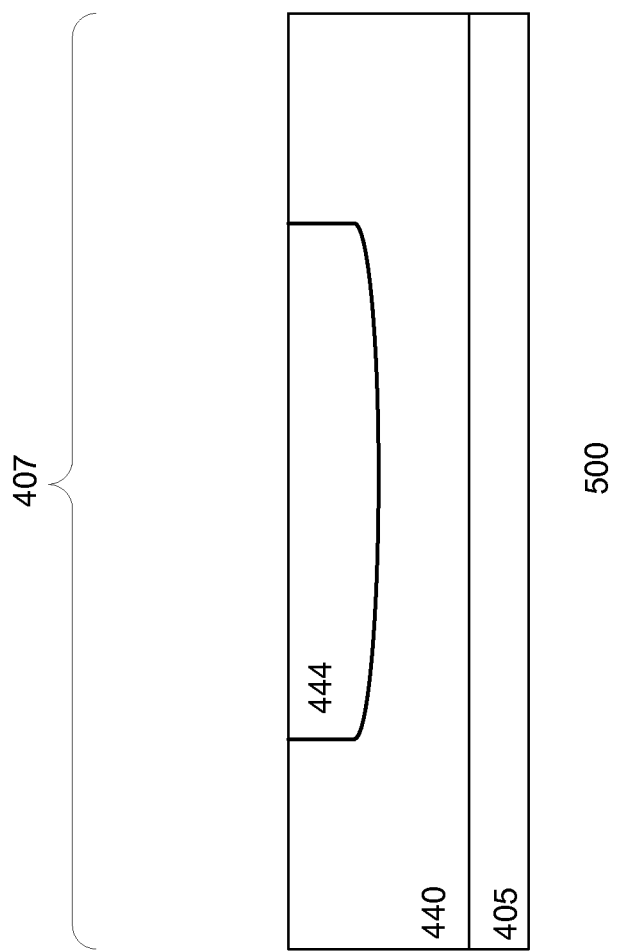

LARGE TUNING RANGE JUNCTION VARACTOR

FIELD OF THE INVENTION

The present invention relates generally to integrated circuits, and more particularly to junction varactors.

BACKGROUND OF THE INVENTION

Integrated circuits (ICs) have numerous circuit components interconnected to provide the desired functions. One type of circuit component is a voltage dependent capacitor, referred to as a varactor. Varactors are commonly used in radio frequency (RF) ICs, for example, forming voltage controlled oscillators (VCOs) or filters. FIG. 1 shows a conventional varactor 100 having a structure of a capacitor 110. The capacitor includes a first electrode 112 (cathode) and a second electrode 118 (anode). A first terminal 160 is coupled to the cathode and a second terminal 170 is coupled to the anode. The anode and cathode are separated by a dielectric region 114. The width of the dielectric region determines the capacitance of the varactor. In general, the wider the dielectric region, the lower the value of the capacitance. Additionally, the larger the electrode area, the higher the capacitance value. The anode and cathode of the varactor can be formed at a p-on-n or n-on-p junction, with the depletion region at the junction serving as a dielectric region.

FIGS. 2a-b show cross-section views of a conventional n-on-p (NP) junction varactor 100. The junction varactor is formed on a substrate 205. The substrate includes a p-well 218. Shallow trench isolations (STIs) 280 define first and second regions 162 and 172a-b. A heavily doped n-type region is provided in the first region, creating an NP junction 214 with the p-well. The n-doped region serves as the anode 118 while the p-well serves as the cathode 112. Contact to the p-well is achieved through heavily doped p-type regions at the surface of the second region. The input and bias voltages are applied to the cathode and anode terminals respectively.

A depletion region, indicated by dotted lines 216a-b, occurs at the NP junction. The capacitance of the varactor corresponds to the width of the depletion region, which can be varied by adjusting the voltages at the terminals. When the NP junction is at zero bias (i.e., $V_{in}=V_{bias}$), the depletion width is at its minimum, corresponding to a maximum capacitance ($C_{max}$), as indicated in FIG. 2a. The width of the depletion region widens as the reverse bias across the junction is increased. Widening the depletion region decreases the capacitance of the varactor. When the maximum reverse voltage is applied, the depletion width is at its widest which corresponds to a minimum capacitance ($C_{min}$), as shown in FIG. 2b.

An important factor is the tuning range of the varactor, which corresponds to the capacitance range in which the varactor operates and is defined by the ratio $C_{max}/C_{min}$. Generally, it is desirable for a varactor to have a large tuning range to provide better functionality. Furthermore, particularly with mobile products, a high quality factor is desirable since this corresponds to low power consumption. Although junction varactors have better linearity compared to MOS-type varactors, they suffer from a smaller tuning range.

From the foregoing discussion, it is desirable to provide a junction varactor with a large tuning range and high quality factor.

SUMMARY OF THE INVENTION

The present invention relates to ICs. In one aspect of the invention, a junction varactor with high tuning range is disclosed. The junction varactor comprises of a first capacitor having the first and second plates formed by the first and second doped wells in a substrate. The first doped well is a doped well of a first-type and the second doped well is a doped well of a second-type. The varactor also includes a second capacitor having the third and fourth plates formed by the second and third doped wells in the substrate. The third doped well is a doped well of the first-type. A first varactor terminal is coupled to the first and third doped wells and a second varactor terminal is coupled to the second doped well. As such, the capacitors are coupled in parallel between the varactor terminals.

In another aspect of the invention, a junction varactor comprises of N capacitors coupled in parallel, wherein N is a whole number greater than or equal to 2. A capacitor includes first and second plates. N+1 alternating first and second-type doped wells are formed in a substrate arranged in which a doped well is disposed within a preceding doped well. The N+1 alternating doped wells form first and second plates of the capacitors. A first varactor terminal is coupled to the doped wells of the first-type and a second varactor terminal is coupled to the doped wells of the second-type.

In yet another aspect of the invention, a method for forming a junction varactor is provided. The method comprises providing a substrate with a defined varactor region. A first doped well of a first-type is formed in the substrate in the varactor region, followed by forming a second doped well of a second-type in the first doped well and a third doped well of the first-type in the second doped well. First and second terminals are formed, wherein the first terminal commonly couples the first and third doped wells and the second terminal is coupled to the second doped well.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 5a-c show a process for forming a varactor in accordance with one embodiment of the invention;

DETAILED DESCRIPTION OF THE INVENTION

The present invention relates to junction varactors. The junction varactors can be incorporated into ICs. In particular, the junction varactors can be easily incorporated into ICs using standard CMOS processing technologies. The ICs can be any type of IC, for example dynamic or static random access memories, signal processors, or system on chip devices, mixed signal or analog devices such as A/D converters and switched capacitor filters. Other types of ICs are also useful. Such ICs are incorporated in, for example, communication systems and various types of consumer products.

Figure 1:
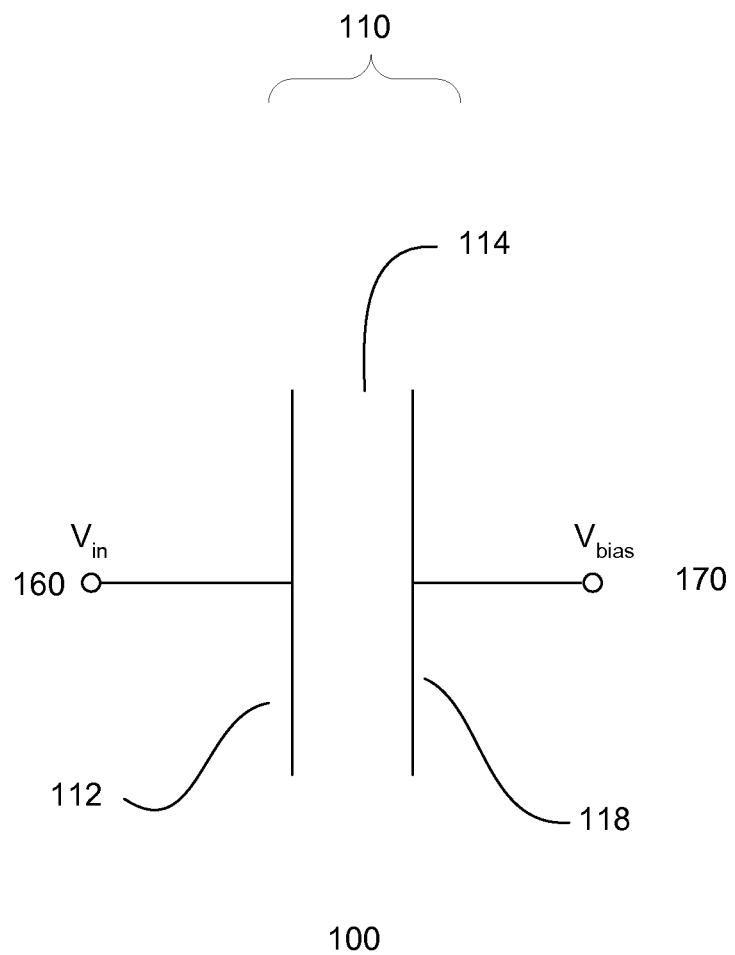
FIG. 1 shows a conventional capacitor structure representing a junction varactor.
Figure 2A:
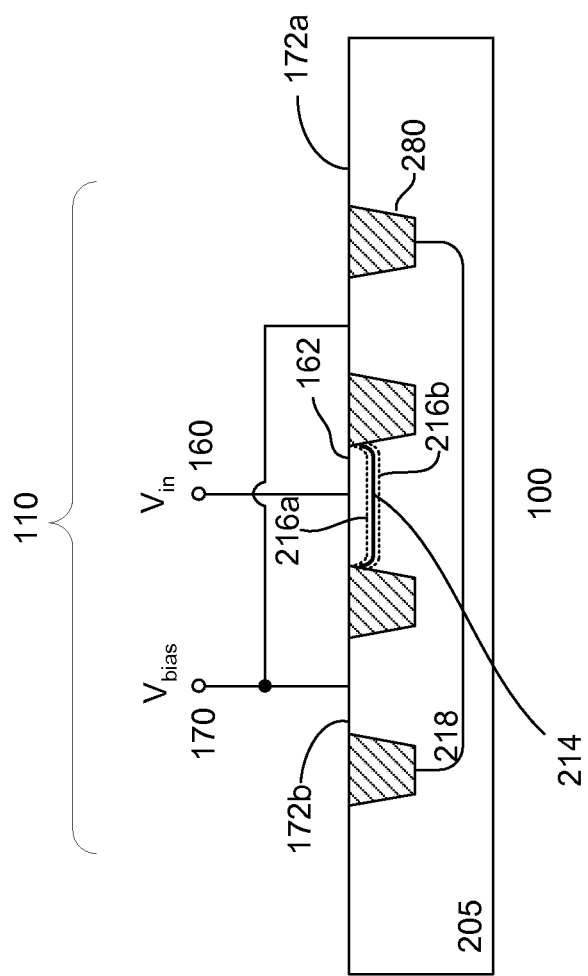
FIGS. 2a-b show cross-sectional views of a conventional junction varactor.
Figure 2B:
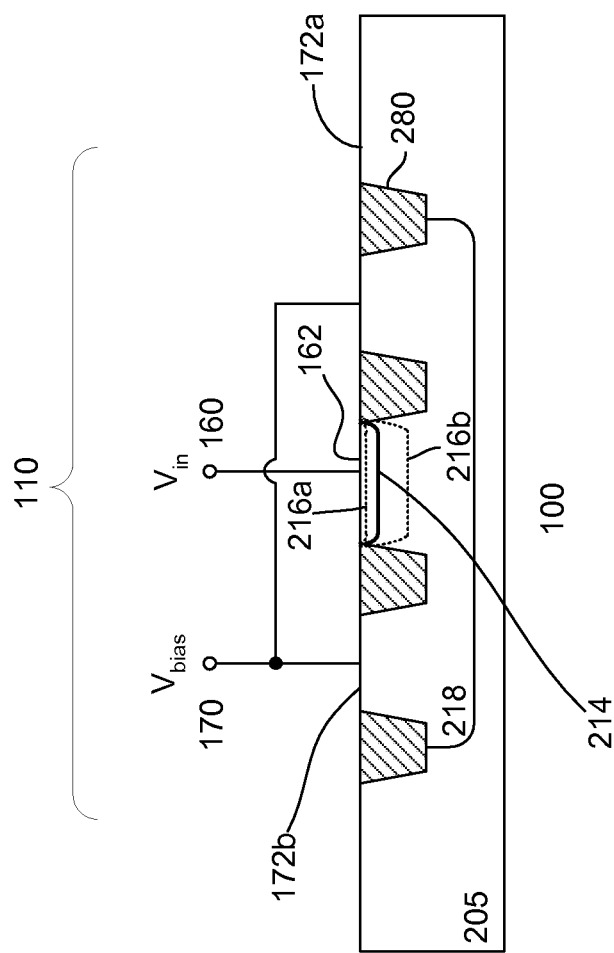
Figure 3:
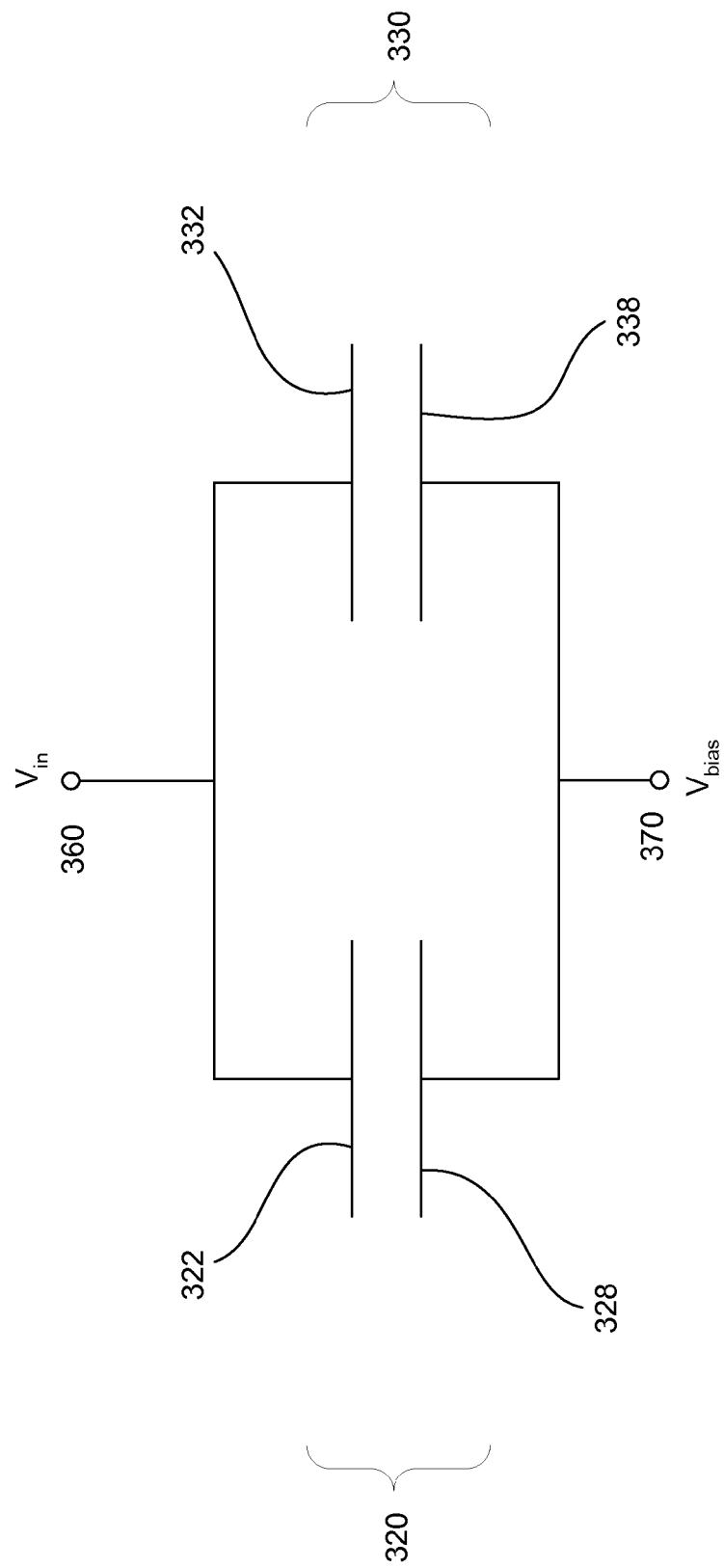
FIG. 3 shows a junction varactor in accordance with one embodiment of the invention which is represented by two capacitors connected in parallel.

FIG. 3 shows a varactor 300 in accordance with one embodiment of the invention. The varactor includes first and second capacitors 320 and 330 coupled in parallel. The capacitors' first electrodes 322 and 332 are commonly coupled to a first terminal 360 and second electrodes 328 and 338 are commonly coupled to a second terminal 370. The first electrodes comprise a first polarity and the second electrodes comprise a second (opposite) polarity. In one embodiment, the first polarity is a p-type polarity and the second polarity is a n-type polarity. For example, the first electrodes are cathodes and the second electrodes are anodes. An input voltage $V_{in}$ is provided to one of the terminals and a bias voltage $V_{bias}$ is provided to the other terminal. Accordingly, the total capacitance across terminals 360 and 370 is equal to the sum of the capacitance of the two individual capacitors.

Figure 4A:
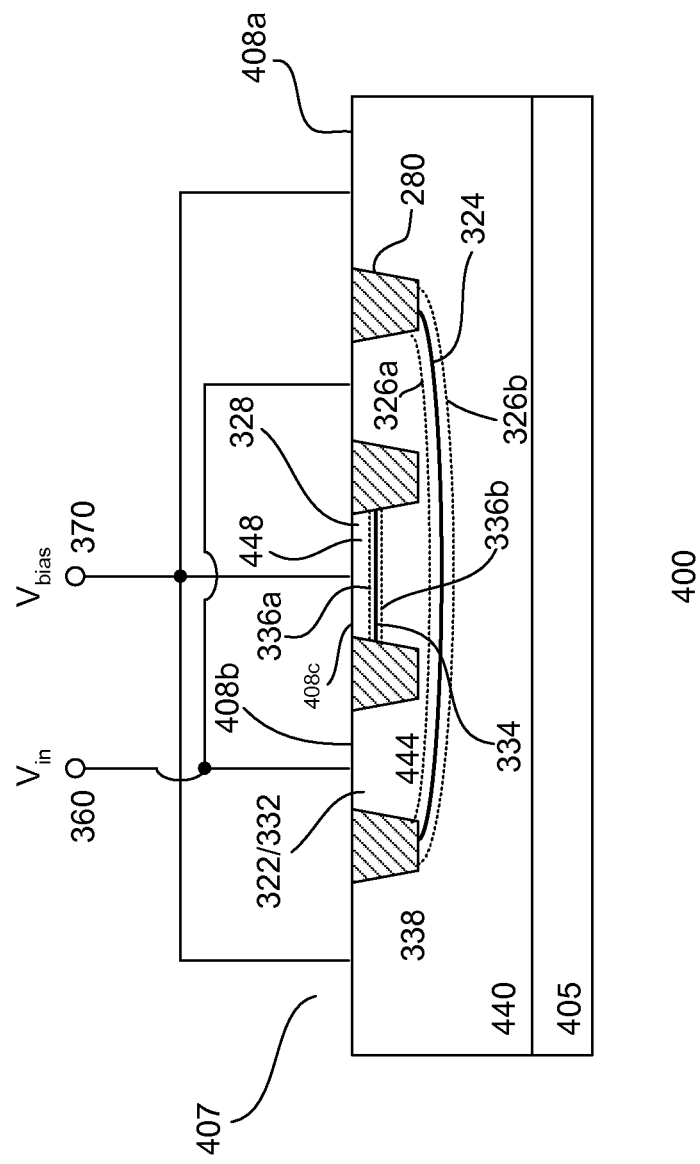
FIGS. 4a-b show cross-sectional views of a junction varactor in accordance with one embodiment of the invention.
Figure 4B:
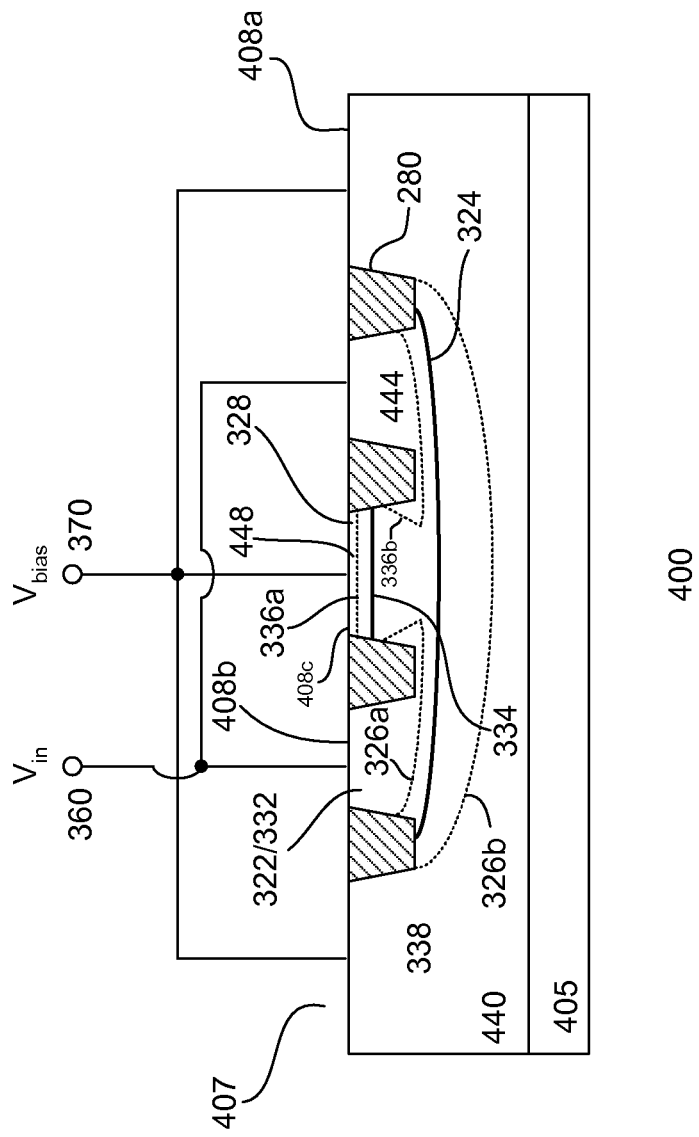

FIGS. 4a-b show cross-sectional views of a junction varactor 400 in accordance with one embodiment of the invention. The junction varactor is formed on a substrate 405. The substrate, for example, comprises of silicon. The substrate, for example, comprises of a lightly doped p-type silicon. Other types of substrates, such as silicon-on-insulator (SOI) or epitaxially grown silicon layers, are also useful.

The varactor is formed in a varactor region 407 defined on the substrate. Isolation regions (not shown) are provided to separate the varactor region from other device regions. The isolation regions comprise, for example, shallow trench isolation (STI) regions. Typically, the STI regions comprise of a trench filled with silicon oxide. Other types of isolation regions are also useful. Three sub-regions 440, 444 and 448 are provided in the varactor region. In one embodiment, the sub-regions comprise of alternating types of doped regions formed beneath the surface of the substrate in the varactor region. The odd numbered doped regions (e.g., first and third) comprise of first-type doped regions while the even numbered doped regions (e.g., second) comprise of second-type doped regions. Ion implantation can be used to form the doped region.

The doped regions, in one embodiment, are arranged such that a doped well is disposed within a preceding doped well. Illustratively, the second doped region located within the first doped region and the third doped region is located within the second doped region. Such a configuration produces first and second PN junctions 324 and 334. The first PN junction is formed by the interface of the first and second doped regions; the second PN junction is formed by the interface of the second and third doped regions. Furthermore, providing doped regions within one another provides contact regions 408a-c on the surface of the substrate for respective doped regions. In one embodiment, for better uniformity of biasing, two contact regions on either side of 408c are provided for the first and the second doped regions and one contact region 408c is provided for the third doped region. Other configurations of contact regions are also useful. The contact regions serve as terminals for the varactor for receiving input and bias voltages. In one embodiment, the first and third contact regions are commonly coupled. In one embodiment, the first and third contact regions are commonly coupled to $V_{in}$ and the second contact regions are coupled to $V_{bias}$. Other arrangements are also useful.

In one embodiment, isolation regions are provided in the substrate. The isolation regions isolate the contact regions on the surface of the substrate. In one embodiment, the isolation regions comprise STI regions. Typically, the STI regions have a depth of about 3000-4000 Å below the substrate surface. Other depths are also useful. In one embodiment, the third doped region is less than the depth of the STI regions, confining it to within the contact region 408c. The second doped region has a depth greater than the depth of the STI regions and extends to an area between the STI regions separating the first and second contact regions. This ensures that the second doped region is coupled to the second contact regions without interfering with the first contact regions. As for the first doped region, it has a depth which is greater than the second doped region, which is also greater than the depth of the STI regions to ensure coupling to contact regions 408a.

Located at each junction is a depletion region, depicted by lines 326a-b and 336a-b. The width of the depletion region, which determines the capacitance of the varactor, can be accomplished by adjusting the voltage across the terminals. The width of the depletion region is inversely related to the capacitance of the varactor. The minimum width of the depletion region corresponds to maximum capacitance ($C_{max}$) while the maximum width of the depletion region corresponds to minimum capacitance ($C_{min}$).

In one embodiment, the odd numbered doped regions comprise n-type doped regions and the second doped regions comprise p-type doped regions, creating a NPN junction varactor. Providing p-type as the first type doped regions and n-type as the second type doped regions to produce a PNP junction varactor is also useful.

The varactor operates from about zero bias to full reverse bias. Generally, the voltage at one terminal is fixed while the voltage at the other terminal is varied. For example, $V_{bias}$ is a fixed voltage while $V_{in}$ is a variable voltage. Other configurations are also useful, such as varying both voltages. In one embodiment, $V_{bias}$ is equal to 0 V and $V_{in}$ is varied from 0 V to $|V_{DD}|$. Providing other input voltage ranges, such as greater than $V_{DD}$ is also useful. Depending on the configuration, $V_{DD}$ is either $+V_{DD}$ or $-V_{DD}$. The range of $V_{in}$ from 0 V to $|V_{DD}|$ corresponds to zero bias to full reverse bias. For example, at $V_{in}=0$ V, the varactor is operating in zero bias. As $V_{in}$ increases, the varactor is operating in increasing reverse bias. The varactor is in full reverse bias when $V_{in}$ reaches $|V_{DD}|$. At zero bias, the width of the depletion regions is at their minimum, as shown in FIG. 4a. This corresponds to $C_{max}$. The depletion regions become wider with increasing reverse bias conditions. At full reverse bias voltage (e.g., $V_{in}$ equal to about $|V_{DD}|$), the depletion regions are at their widest, which corresponds to $C_{min}$.

In accordance with one embodiment of the invention, the doped regions are configured such that at or near full reverse bias, the depletion regions of the first and second junctions merge, as shown in FIG. 4b. For example, the vertical distance between the first and second junctions should be sufficiently close to result in the merging of the depletion regions at or near full reverse bias. Additionally, the lower portion of the first depletion region 326b at full reverse bias is sufficiently within the first doped region to avoid leakage or punch through.

In accordance with one embodiment of the invention, $C_{max}$ of the varactor (at zero bias) is equal to the sum of the first and second depletion regions. Comparing with conventional junction varactors having only a single depletion region, the varactor of the present invention with double depletion regions has a greater $C_{max}$. Furthermore, with increasing reverse bias and the merging of the depletion regions, the varactor of the present invention can have a significantly reduced capacitance area. This results in varactors of the present invention having a smaller capacitance area contributing to $C_{min}$ as compared with the area contributing to $C_{max}$. The combination of increasing $C_{max}$ and decreasing $C_{min}$ increases the tuning range of the varactor.

In alternative embodiments, the depletion regions of the varactor do not merge when at full reverse bias. For such applications, the overall tuning range may still be improved, although with both $C_{max}$ and $C_{min}$ being higher than conventional configuration due to double capacitor design. In one embodiment, the increase in $C_{max}$ is greater than the increase in $C_{min}$, resulting in an improved tuning range over conventional varactors.

In yet another embodiment, the varactor comprises a plurality of N capacitors coupled in parallel. N+1 alternating types of doped wells are provided in the varactor region. For example, odd numbered wells are p-type doped wells while even numbered wells are n-type doped wells. Providing n-type doped wells for odd numbered wells and p-type doped wells for even numbered wells is also useful. In one embodiment, the doped wells are formed within a preceding doped well, with respective contact regions on the surface of the substrate. The contact regions are isolated from one another by, for example, STIs. The doped wells of the same type are commonly coupled to a terminal. P-wells are commonly coupled to a first terminal and n-wells are commonly coupled to a second terminal.

In the case where N=3 (3 capacitors coupled in parallel), 4 doped wells are provided. Similar to the junction varactor of FIGS. 4a-b, junctions are formed at the interface of two doped wells. As such, N junctions are formed from N+1 doped wells. The width of the junctions can be varied by adjusting the voltage across the terminals. At zero bias, the junction width is at its narrowest, corresponding to $C_{max}$. Since the total capacitance of the varactor is equal to the sum of the N junction capacitances, $C_{max}$ can be increased by N times compared to conventional junction varactors. With increasing reverse bias, the junctions widen. Preferably, one or some of the junctions merge at or near full reverse bias. More preferably, all of the junctions merge at or near full reverse bias. With the merging of the junctions, the junction width can be increased. As a result, $C_{min}$ can be reduced.

Figure 5B:
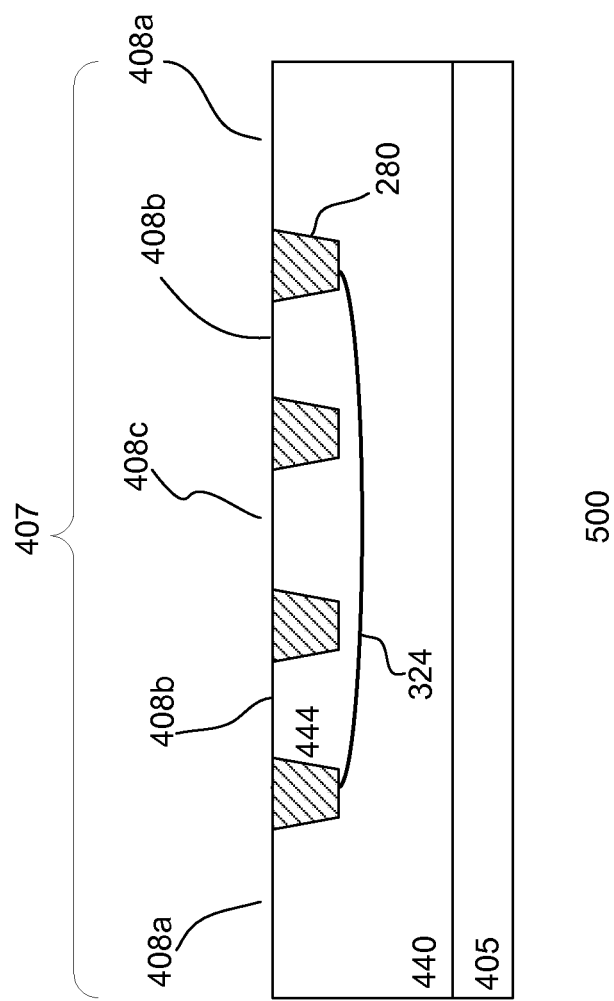
Figure 5C:
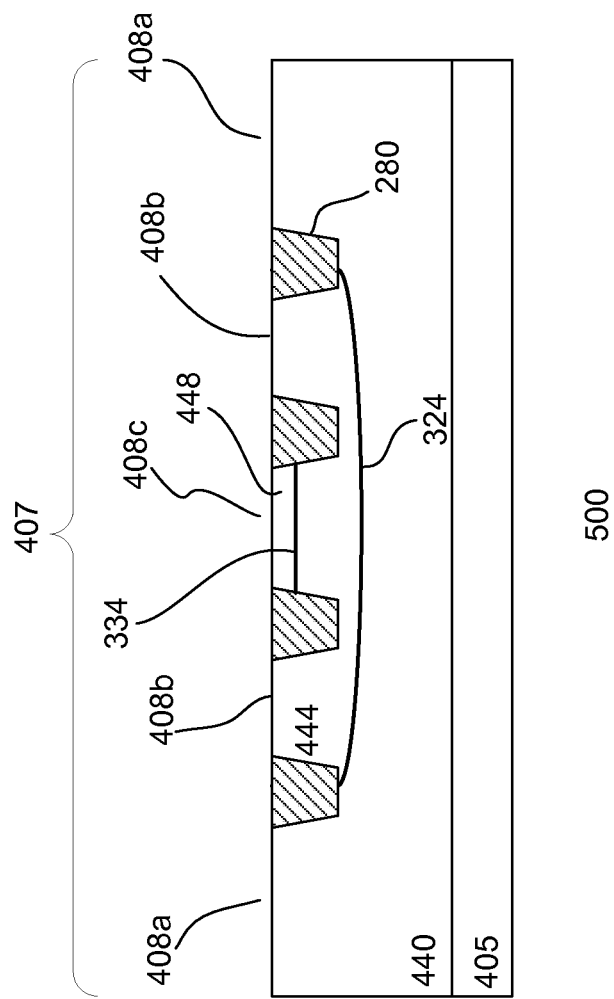

FIGS. 5a-c show a process for forming a NPN varactor 500 in accordance with one embodiment of the invention. Referring to FIG. 5a, a semiconductor substrate 405, such as a p-type silicon substrate is provided. Other types of substrates, such as SOI, epitaxial silicon layers, may also be used. The substrate is prepared with a first well 440. The first well comprises n-type well (n-well). The first n-well defines a varactor region 407 on the substrate. A second well 444 is provided within the first well. The second well comprises a p-type well (p-well).

To form the wells, conventional ion implantation techniques, such as implantation with a mask can be used. In one embodiment, separate ion implantation processes are used for different wells. Suitably tailored well implants of a CMOS process can be shared to form the wells. Preferably, the wells can be formed without the use of additional masks. For example, the p-well of the varactor can be formed when p-wells for CMOS devices are formed using the same implant mask. Alternatively, the wells for the varactors are formed separately from wells of the CMOS devices, using additional masks. This allows wells to be optimized for the varactors.

In FIG. 5b, STIs 280 are formed, defining contact regions 408a-c on the surface of the substrate as well as isolating the varactor region from other device regions. The STIs can be formed using various conventional processes. For example, the substrate can be etched using conventional etch and mask techniques to form trenches which are then filled with dielectric material such as silicon oxide. Chemical mechanical polishing (CMP) can be performed to remove excess oxide and provide a planar substrate top surface. The depth of the STIs is not as deep as the first and second wells. As such, the PN junction 324 along with its depletion region is located below the STIs. Contact regions 408a are in communication with the first well and contact regions 408b are in communication with the second well. As described, STIs are formed after the first and second doped wells are formed. Alternatively, the STIs can be formed prior to the formation of the first or both doped wells.

Referring to FIG. 5c, a third doped well 448 is formed in the third contact region. The third doped well comprises a n-well. In one embodiment, the n-well comprises a heavily doped n-well, for example, about 3e15/cc. The interface of the second doped well and third doped well forms a NP junction 334. In one embodiment, the heavily doped well can also serve as a contact for the third contact region. During the formation of the third well, contacts for the first contact regions can also be formed. P-type contacts are also formed in the second contact regions in a separate process. Preferably, the contacts are formed in the same process for forming source/drain implants of CMOS or bipolar processes.

The process continues to form interconnections to the varactor contact regions to provide the bias and input voltages, as desired. The area occupied by the present invention may or may not be the same as the conventional varactors, depending of design requirements. As described, the process forms a NPN varactor. The process can be easily modified to form a PNP varactor. For example, the first and third doped wells comprise p-wells while the second doped well comprises a n-well.

As described, the varactor of the present invention can be easily integrated into conventional CMOS processes without the use of any extra mask for implantation. The present invention can also be easily integrated into convention bipolar processes. For example, the masks can be modified to include implants for the varactors. By sharing of masks with other devices, no additional steps are required, thus reducing manufacturing cost.

A simulation was conducted to compare the tuning range of a NPN junction varactor in accordance with an embodiment of the invention and a conventional NP junction varactor. The parameters of the varactors were simulated using a standard 1.8 V, 0.18 μm process. The simulation includes applying an input voltage to the n-type electrode of the NP varactor and to the p-type electrode of the NPN varactor. The input voltage was swept from zero bias to full reverse bias. For the NP junction varactor, the input voltage was swept from 0 to 1.8 V, whereas the input voltage was swept from 0 to −1.8 V for the NPN junction varactor.

Figure 6:
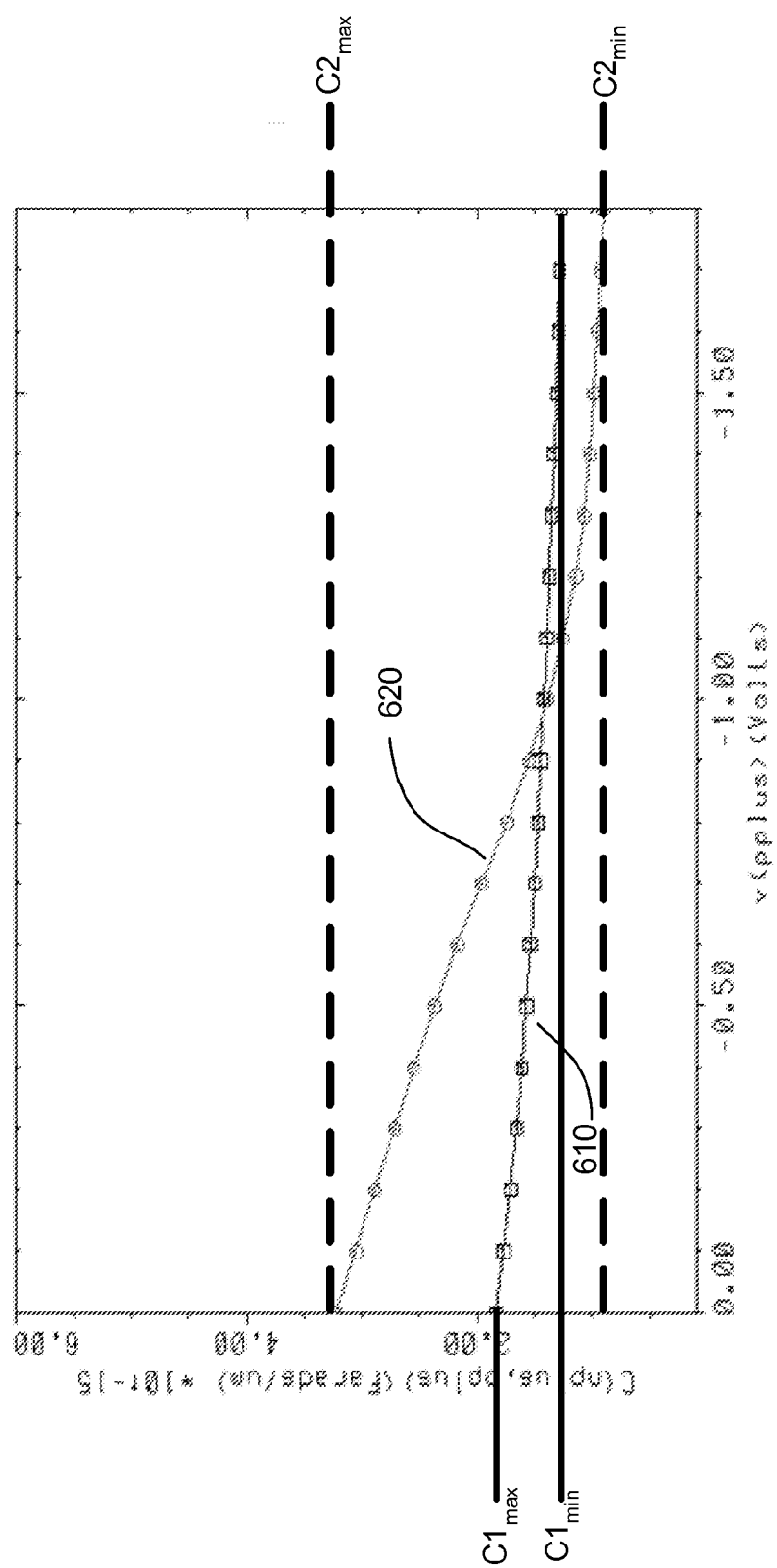
FIG. 6 shows simulated CV curves of a conventional junction varactor and of one in accordance with an embodiment of the invention for a standard CMOS process.

FIG. 6 shows the capacitance-voltage (CV) curves of the varactors from the simulation. CV curve 610 corresponds to the conventional NP junction varactor and CV curve 620 corresponds to the NPN junction varactor. As shown in FIG. 6, the NP junction varactor has a minimum capacitance $C1_{min}$ of about $1.25 \times 10^{-15}$ F/μm and a maximum capacitance $C1_{max}$ of about $1.8 \times 10^{-15}$ F/μm. The tuning range of the NP junction varactor, which is the ratio of $C_{max}/C_{min}$ is about 1.45. The NPN junction varactor, on the other hand, has a minimum capacitance $C2_{min}$ of about $0.9 \times 10^{-15}$ F/μm and a maximum capacitance $C2_{max}$ of about $3.25 \times 10^{-15}$ F/μm, resulting in a tuning range of about 3.6. Clearly, the NPN junction varactor of the present invention has almost 2.5 times the tuning range of a convention NP junction varactor.

Figure 7:
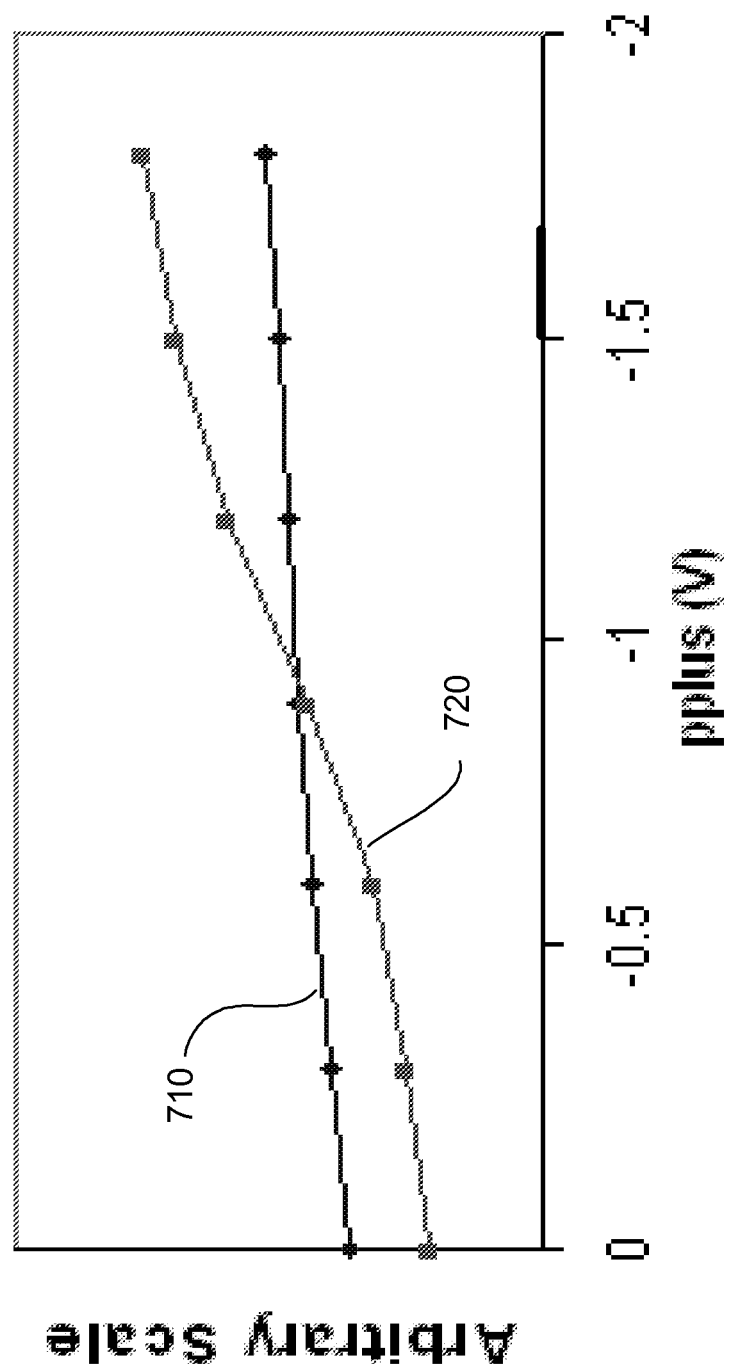
FIG. 7 shows simulated quality factor curves of a conventional junction varactor and of one in accordance with an embodiment of the invention for a standard CMOS process.

The associated quality factor derived from the resistance and capacitance values of these two designs were also simulated. The values of quality factor (based on an arbitrary scale) as a function of input voltage are plotted in FIG. 7. Curves 710 and 720 correspond respectively to the NP and NPN junction varactors. As evidenced by the curves, the NPN junction varactor, has a lower quality factor at lower reverse bias conditions, for example, below about −0.9 V while at higher reverse bias conditions, above −0.9 V, the NPN junction has a higher quality factor than the NP junction varactor. As such, the NPN junction varactor consumes less power in high bias conditions than the NP junction varactor. Since a relatively larger amount of power is consumed in high bias conditions than in low bias conditions, the ability to reduce power consumption under such conditions has a greater impact and thus is more desirable.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A junction varactor comprising:
a substrate having a varactor region in which the varactor is formed;
first isolation regions in the varactor region, wherein the first isolation regions forming a first substrate surface region between inner edges of the first isolation regions;
second isolation regions in the varactor region, wherein the first isolation regions are within the second isolation regions, the first and second isolation regions forming second substrate surface regions between outer edges of the first isolation regions and inner edges of the second isolation regions;
third substrate surface regions from the outer edges of the second isolation regions;
a first doped region of a first polarity type in the varactor region, the first doped region is disposed from the first substrate surface region between the inner edges of the first isolation regions to a first depth which is shallower than a bottom of the first isolation regions;
a second doped region of a second polarity type in the varactor region, the second doped region is disposed from the second substrate surface regions to a second depth which is below a bottom of the second isolation regions and the bottom of the first isolation regions, the second doped region extends between bottoms of the second isolation regions, the first and second doped regions form a first junction between the first isolation regions;
a third doped region of the first polarity type in the varactor region, the third doped region is disposed from the third substrate surface regions to a third depth which is below the second depth, the third doped region encompasses the first and second doped regions, the second and third doped regions form a second junction between and below the bottoms of the second isolation regions;
a first varactor terminal coupled to the first and third substrate surface regions for coupling to the first and third doped regions; and
a second varactor terminal coupled to the second substrate surface regions for coupling to the second doped region.

2. The junction varactor of claim 1 wherein:
the first polarity type comprises an n-type polarity and the second polarity type comprises a p-type polarity; or
the first polarity type comprises a p-type polarity and the second polarity type comprises an n-type polarity.

3. The junction varactor of claim 2 wherein:
the first junction includes a first depletion region located at an interface of the first and second doped regions; and
the second junction includes a second depletion region located at an interface of the second and third doped regions.

4. The junction varactor of claim 3 wherein the first and second depletion regions vary in width depending on a voltage potential applied across the varactor terminals from about zero bias to full reverse bias.

5. The junction varactor of claim 3 wherein the first and second depletion regions merge when the junction varactor is operating at or near full reverse bias.

6. The junction varactor of claim 1 wherein the varactor comprises a tuning range of at least about 3.6.

7. The junction varactor of claim 1 wherein first, second and third contact regions are provided on a surface of the substrate for the first, second and third doped regions for the first and second terminals.

8. The junction varactor of claim 1 wherein a first junction having a first depletion region is formed at an interface of the first and second doped regions and a second junction having a second depletion region is located at an interface of the second and third doped regions.

9. The junction varactor of claim 8 wherein the first and second depletion regions vary in width depending on a voltage potential applied across the varactor terminals from about zero bias to full reverse bias.

10. The junction varactor of claim 8 wherein the first and second depletion regions merge when the junction varactor is operating at or near full reverse bias.

11. A junction varactor comprising:
N+1 alternating first and second polarity-type doped wells in a doped region of a substrate, the doped wells are arranged such that a doped well is disposed within a preceding doped well, the N+1 alternating doped wells forming the first and second plates of the capacitors of the varactor, wherein N is an integer equal to or greater than 1;
first isolation regions in the doped region, wherein the first isolation regions forming a first substrate surface region between inner edges of the first isolation regions;
second isolation regions in the doped region, wherein the first isolation regions are within the second isolation regions, the first and second isolation regions forming second substrate surface regions between outer edges of the first isolation regions and inner edges of the second isolation regions;
third substrate surface regions from the outer edges of the second isolation regions;
a first doped well of a first polarity type in the doped region, the first doped well is disposed from the first substrate surface region between the inner edges of the first isolation regions to a first depth which is shallower than a bottom of the first isolation regions;
a second doped well of a second polarity type in the doped region, the second doped well is disposed from the second substrate surface regions to a second depth which is below a bottom of the second isolation regions and the bottom of the first isolation regions, the second doped well extends between bottoms of the second isolation regions, the first and second doped regions form a first junction between the first isolation regions;

a third doped well of the first polarity type in the doped region, the third doped well is disposed from the third substrate surface regions to a third depth which is below the second depth, the third doped region encompasses the first and second doped regions, the second and third doped wells form a second junction between and below the bottoms of the second isolation regions;

a first varactor terminal coupled to the first and third substrate surface regions for coupling to the first and third doped regions; and a second varactor terminal coupled to the second substrate surface regions for coupling to the second doped region, wherein the coupling of the doped wells by the varactor terminals forms a large tuning range varactor.

12. A method for forming a junction varactor comprising:

providing a substrate with a defined varactor region in which the varactor is formed;

forming first isolation regions in the varactor region, wherein the first isolation regions forming a first substrate surface region between inner edges of the first isolation regions;

forming second isolation regions in the varactor region, wherein the first isolation regions are within the second isolation regions, the first and second isolation regions forming second substrate surface regions between outer edges of the first isolation regions and inner edges of the second isolation regions;

forming third substrate surface regions from the outer edges of the second isolation regions;

forming a first doped region of a first polarity type in the varactor region, the first doped region is disposed from the first substrate surface region between the inner edges of the first isolation regions to a first depth which is shallower than a bottom of the first isolation regions;

forming a second doped region of a second polarity type in the varactor region, the second doped region is disposed from the second substrate surface regions to a second depth which is below a bottom of the second isolation regions and the bottom of the first isolation regions, the second doped region extends between bottoms of the second isolation regions, the first and second doped regions form a first junction between the first isolation regions;

forming a third doped region of the first polarity type in the varactor region, the third doped region is disposed from the third substrate surface regions to a third depth which is below the second depth, the third doped region encompasses the first and second doped regions, the second and third doped regions form a second junction between and below the bottoms of the second isolation regions;

forming a first varactor terminal coupled to the first and third substrate surface regions for coupling to the first and third doped regions; and forming a second varactor terminal coupled to the second substrate surface regions for coupling to the second doped region, wherein the coupling of the doped regions by the varactor terminals forms a large tuning range varactor.

13. The method of claim 12 wherein:

the first polarity type comprises n-type and the second polarity type comprises p-type; or the first polarity type comprises p-type and the second polarity type comprises n-type.

14. The method of claim 12 wherein first, second and third contact regions are provided on a surface of the substrate for the first, second and third doped regions for the first and second terminals.

15. The method of claim 12 wherein the varactor comprises a tuning range of at least about 3.6.

16. The method of claim 12 wherein a first junction having a first depletion region is located at an interface of the first and second doped regions and a second junction having a second depletion region is located at an interface of the second and third doped regions.

17. The method of claim 16 wherein the first and second depletion regions vary in width depending on a voltage potential applied across the varactor terminals from about zero bias to full reverse bias.

18. The method of claim 16 wherein the first and second depletion regions merge when the junction varactor is operating at or near full reverse bias.

19. The junction varactor in claim 1 wherein the second junction contacts a bottom surface of the second isolation regions.

20. The junction varactor in claim 11 wherein the second junction contacts a bottom surface of the second isolation regions.

21. The method in claim 12 wherein the second junction contacts a bottom surface of the second isolation regions.

* * * * *